United States Patent
Pulugurtha et al.

(10) Patent No.: US 11,626,488 B2
(45) Date of Patent: *Apr. 11, 2023

(54) INTEGRATED ASSEMBLIES AND METHODS OF FORMING INTEGRATED ASSEMBLIES

(71) Applicant: Micron Technology, Inc., Boise, ID (US)

(72) Inventors: Srinivas Pulugurtha, Boise, ID (US); Jaydip Guha, Boise, ID (US); Scott E. Sills, Boise, ID (US); Yi Fang Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/453,621

(22) Filed: Nov. 4, 2021

(65) Prior Publication Data

US 2022/0069083 A1    Mar. 3, 2022

Related U.S. Application Data

(63) Continuation of application No. 16/952,774, filed on Nov. 19, 2020, now Pat. No. 11,335,775.

(Continued)

(51) Int. Cl.
*H01L 23/495* (2006.01)
*H01L 29/10* (2006.01)
(Continued)

(52) U.S. Cl.
CPC .. *H01L 29/1033* (2013.01); *H01L 21/823412* (2013.01); *H01L 27/0629* (2013.01);
(Continued)

(58) Field of Classification Search
CPC ......... H01L 29/1033; H01L 21/823412; H01L 27/0629; H01L 27/10805; H01L 27/11502;
(Continued)

(56) References Cited

U.S. PATENT DOCUMENTS 5,973,381 A    10/1999  Kudo et al.
8,319,269 B2   11/2012  Ieda
(Continued)

FOREIGN PATENT DOCUMENTS

JP    2009-033118    2/2009

OTHER PUBLICATIONS

WO PCT/US2021/044134 Search Rept. Nov. 19, 2021, Micron Technology, Inc.
(Continued)

*Primary Examiner* — David Vu
(74) *Attorney, Agent, or Firm* — Wells St. John P.S.

(57) ABSTRACT

Some embodiments include a transistor having an active region containing semiconductor material. The semiconductor material includes at least one element selected from Group 13 of the periodic table in combination with at least one element selected from Group 16 of the periodic table. The active region has a first region, a third region offset from the first region, and a second region between the first and third regions. A gating structure is operatively adjacent to the second region. A first carrier-concentration-gradient is within the first region, and a second carrier-concentration-gradient is within the third region. Some embodiments include methods of forming integrated assemblies.

21 Claims, 6 Drawing Sheets

Related U.S. Application Data

(60) Provisional application No. 63/071,251, filed on Aug. 27, 2020.

(51) Int. Cl.
  *H01L 29/24* (2006.01)
  *H01L 27/11502* (2017.01)
  *H01L 27/06* (2006.01)
  *H01L 21/8234* (2006.01)
  *H01L 27/108* (2006.01)

(52) U.S. Cl.
  CPC .. *H01L 27/10805* (2013.01); *H01L 27/11502* (2013.01); *H01L 29/24* (2013.01)

(58) Field of Classification Search
  CPC ............... H01L 29/24; H01L 27/10808; H01L 27/10873; H01L 29/7869; H01L 29/78642
  See application file for complete search history.

(56) References Cited

U.S. PATENT DOCUMENTS

| | | |
|---|---|---|
| 2015/0311316 A1 | 10/2015 | Park |
| 2017/0069658 A1 | 3/2017 | Yamada et al. |
| 2019/0067298 A1 | 2/2019 | Karda et al. |
| 2020/0006393 A1 | 1/2020 | Yamazaki et al. |

OTHER PUBLICATIONS

WO PCT/US2021/044134 Writ. Opin. Nov. 19, 2021, Micron Technology, Inc.

INTEGRATED ASSEMBLIES AND METHODS OF FORMING INTEGRATED ASSEMBLIES

RELATED PATENT DATA

This patent resulted from a continuation of U.S. patent application Ser. No. 16/952,774, filed Nov. 19, 2020, which claims priority to and the benefit of U.S. Provisional Patent Application Ser. No. 63/071,251, filed Aug. 27, 2020, the disclosures of which are incorporated herein by reference.

TECHNICAL FIELD

Integrated assemblies (e.g., integrated memory). Methods of forming integrated assemblies.

BACKGROUND

Memory may utilize memory cells which individually comprise an access device (e.g., an access transistor) in combination with a storage element (e.g., a capacitor, a resistive memory device, a phase change memory device, etc.).

It would be desirable to develop improved transistors and improved memory architecture.

DETAILED DESCRIPTION OF THE ILLUSTRATED EMBODIMENTS

Some embodiments include a transistor which has a channel region comprising semiconductor material (e.g., semiconductor oxide). The channel region has a first side and an opposing second side. The transistor may have a first carrier-concentration-gradient outward of the first side of a channel region, and may have a second carrier-concentration-gradient outward of the second side of the channel region. The transistor may be utilized as an access device of a memory cell. Some embodiments include methods of forming integrated assemblies. Example embodiments are described with reference to FIGS. 1-6.

Figure 1A:
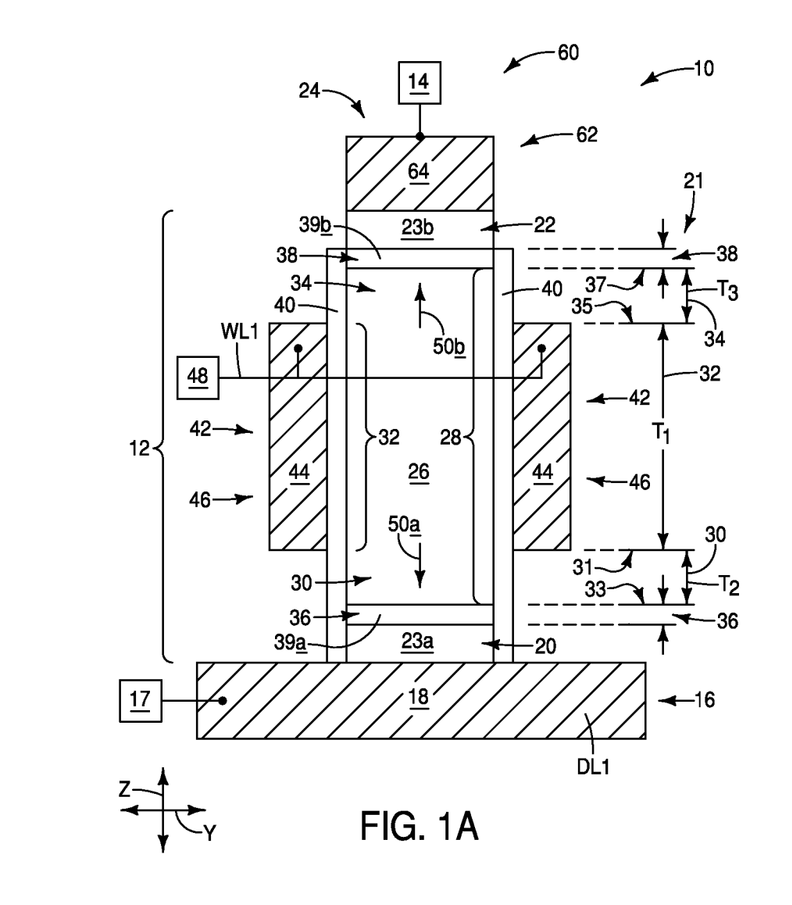
FIG. 1A is a diagrammatic cross-sectional side view of an example transistor.

Referring to FIG. 1A, an integrated assembly 10 includes an access device (access transistor) 12 between a storage element 14 and a conductive structure 16.

The storage element 14 may be any suitable device having at least two detectable states; and in some embodiments may be, for example, a capacitor, a resistive-memory-device, a conductive-bridging-device, a phase-change-memory (PCM) device, a programmable-metallization-cell (PMC), etc. If the storage element is a capacitor, it may be either a ferroelectric capacitor (i.e., may comprise ferroelectric insulative material between a pair of capacitor electrodes) or may be a non-ferroelectric capacitor (i.e., may comprise only non-ferroelectric insulative material between a pair of capacitor electrodes). Example ferroelectric insulative material may include one or more of transition metal oxide, zirconium, zirconium oxide, niobium, niobium oxide, hafnium, hafnium oxide, lead zirconium titanate, and barium strontium titanate. Example non-ferroelectric insulative material may comprise, consist essentially of, or consist of silicon dioxide.

The conductive structure 16 may be a linearly-extending-structure, and may, for example, correspond to a digit line (bitline, sense line, etc.), and may be coupled with sensing circuitry (e.g., sense-amplifier-circuitry) 17. The structure 16 is labeled as DL1 to indicate that it may be a digit line in some embodiments.

The linearly-extending-structure 16 extends along a first direction, with such a first direction being indicated to be a y-axis direction along the view of FIG. 1A. The linearly-extending-structure 16 may be straight, curved, wavy, etc.

The conductive structure 16 comprises conductive material 18. The conductive material 18 may comprise any suitable electrically conductive composition(s); such as, for example, one or more of various metals (e.g., titanium, tungsten, molybdenum, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive structure 16 may comprise, consist essentially of, or consist of tungsten and/or molybdenum.

The conductive structure 16 may be supported by a semiconductor base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials, such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The access device 12 includes a pillar 24. The pillar 24 extends vertically in the configuration of FIG. 1A (i.e., extends along an illustrated z-axis). In some embodiments, the pillar 24 may be referred to as a vertically-extending pillar. The pillar 24 may be substantially vertical, with the term "substantially vertical" meaning vertical to within reasonable tolerances of fabrication and measurement. In some embodiments, the vertically-extending pillar may extend orthogonally relative to the illustrated y-axis. In some embodiments, the vertically-extending pillar may be about orthogonal to the illustrated y-axis, with the term "about orthogonal" meaning orthogonal to within about ±15°.

The pillar 24 includes a bottom conductive region 20 and a top conductive region 22. The regions 20 and 22 comprise conductive-oxide-materials (e.g., conductive-metal-oxides) 23a and 23b, respectively. One of the conductive-oxide-materials 23a and 23b may be referred to as a first conductive-oxide-material, and the other may be referred to as a second conductive-oxide-material. The materials 23a and 23b may be compositionally the same as one another, or may be compositionally different relative to one another. The metal-oxide-materials 23a and 23b may comprise any suitable composition(s), and in some embodiments may comprise, consist essentially of, or consist of oxygen in combination with one or more of indium, zinc and tin. In some embodiments, the conductive-oxide-materials 23a and 23b may comprise oxygen in combination with zinc, and may further comprise one or both of aluminum and gallium. The aluminum and gallium may be present as dopants within zinc oxide.

A semiconductor-material-containing-structure (region) 28 is between the regions 20 and 22, with the structure 28 comprising semiconductor material 26. The semiconductor material 26 may comprise any suitable composition(s); and in some embodiments may comprise, consist essentially of, or consist of at least one metal (e.g., one or more of aluminum, gallium, indium, thallium, tin, cadmium, zinc, etc.) in combination with one or more of oxygen, sulfur, selenium and tellurium. In some embodiments, the semiconductor material 26 may comprise at least one element from Group 13 of the periodic table (e.g., gallium) in combination with at least one element from Group 16 of the periodic table (e.g., oxygen). For instance, the semiconductor material 26 may comprise at least one element selected from the group consisting of gallium, indium and mixtures thereof, in combination with at least one element selected from the group consisting of oxygen, sulfur, selenium, tellurium and mixtures thereof. In some embodiments, the semiconductor material 26 may comprise, consist essentially of, or consist of a semiconductor oxide (i.e., a semiconductor material comprising oxygen). For instance, in some embodiments the semiconductor material 26 may comprise, consist essentially of, or consist of InGaZnO (where the chemical formula indicates primary constituents rather than a specific stoichiometry).

The semiconductor-material-containing-structure 28 may be considered to comprise a first region 30, a third region 34 offset from the first region, and a second region 32 between the first and third regions. In the illustrated embodiment, the first and third regions are vertically offset relative to one another. In other embodiments, the first and third regions may be laterally offset relative to one another, in addition to, or alternatively to, being vertically offset relative to one another.

A scale 21 is provided laterally adjacent to the assembly 10 to assist the reader in understanding the relative positions of the regions 30, 32 and 34, and some of the edges associated with such regions. The first region 30 may be considered to have an inner edge 31 adjacent the second region 32, and to have an outer edge 33 distal from the second region 32. Similarly, the second region 34 may be considered to have an inner edge 35 adjacent the second region 32, and to have an outer edge 37 distal from the second region 32.

The regions 30, 32 and 34 may have any suitable vertical thicknesses. In some embodiments, the region 32 comprises a vertical thickness $T_1$ within a range of from about 200 angstroms (Å) to about 1200 Å. In some embodiments, the regions 30 and 34 comprise vertical thicknesses $T_2$ and $T_3$, respectively, which each may be within a range of from about 50 Å to about 400 Å. In some embodiments, the vertical thicknesses $T_2$ and $T_3$ of the regions 30 and 34 may be substantially the same as one another, and in other embodiments such vertical thicknesses may be different relative to one another. The term "substantially the same" means the same to within reasonable tolerances of fabrication and measurement.

The embodiment of FIG. 1A has regions 36 and 38 outward of the first and third regions 30 and 34, and inward of the metal-oxide-regions 20 and 22. In some embodiments, the semiconductor material 26 may comprise semiconductor oxide (e.g., InGaZnO, where the chemical formula indicates primary constituents rather than a specific stoichiometry). The regions 36 and 38 may comprise one or more components from the semiconductor oxide, but may be oxygen-depleted relative to the semiconductor oxide to thereby have higher conductivity than the semiconductor oxide. The regions 36 and 38 may be referred to as first and second oxygen-depleted-regions, respectively. The regions 36 and 38 are shown to comprise oxygen-depleted-materials 39a and 39b, respectively. Such materials may be a same composition as one another, or may be different compositions relative to one another. In some embodiments, the materials 39a and 39b may both comprise, consist essentially of, or consist of one or more of indium, gallium and zinc.

In the illustrated embodiment, the conductive-oxide-materials 23a and 23b are electrically coupled to the regions 30 and 34 of the semiconductor-material-containing-structure 28 through the oxygen-depleted-regions 36 and 38. In some embodiments, one or both of the oxygen-depleted-regions (36 and 38) and/or one or both of the conductive-oxide-material-containing-regions 20 and 22 may be omitted.

The semiconductor-containing-structure 28 may be considered to be correspond to an active region of the access device 12.

The access device 12 includes insulative material 40 along sidewalls of the active region 28. In the shown embodiment, the insulative material 40 extends to an upper surface of the upper oxygen-depleted-region 38. In other embodiments, the insulative material 40 may to a different height along the pillar 24.

The insulative material 40 may be referred to as gate dielectric material. The insulative material 40 may comprise any suitable composition(s), and in some embodiments may comprise silicon dioxide and/or one or more high-k compositions (with the term "high-k" meaning a dielectric constant greater than that of silicon dioxide). Example high-k compositions (materials) include aluminum oxide, zirconium oxide, hafnium oxide, etc.

Gating structures (conductive gates) 42 are adjacent to the second region 32 of the semiconductor-containing-structure 28. The gating structures 42 comprise conductive-gate-material 44. The conductive-gate-material may comprise any suitable electrically conductive composition(s); such as, for example, one or more of various metals (e.g., titanium, tungsten, molybdenum, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive-gate-material 44 may configured as a linearly-extending-structure 46 which extends in and out of the page relative to the cross-sectional view of FIG. 1A. The linearly-extending-structure 46 may be considered to extend along a second direction which crosses the first direction (the illustrated y-axis direction). The second direction of the second linearly-extending-structure (second linear structure) 46 may be orthogonal to (or at least substantially orthogonal to) the first direction of the first linearly-extending-structure (first linear structure) 16. The second linearly-extending-structure 46 may be straight, curved, wavy, etc.

The second linearly-extending-structure 46 may correspond to a wordline WL1, and may be coupled with driver circuitry 48 (e.g., wordline-driver-circuitry).

Operation of the transistor 12 comprises gatedly coupling the first and third regions 30 and 34 to one another through the second region 32 (the region 32 may be referred to as a gated channel region, or simply as a channel region). When the term "gated coupling" is utilized herein, such may refer to the controlled coupling/decoupling of the regions 30 and 34 that may be induced by electrical activation/deactivation the wordline WL1. The coupling/decoupling of the regions 30 and 34 may be utilized to couple/decouple the structures 14 and 16. In some operational modes of the transistor 12, electrical flow through the channel region 32 is induced by an electric field provided by the gating structure 42, and accordingly the conductive structure 16 is electrically coupled through the semiconductor-containing-structure 28 to the storage element 14. In other operational modes, a suitable electric field is not provided to the channel region 32, and accordingly the conductive structure 16 is decoupled from the storage element 14.

The gated coupling of the regions 30 and 34 with one another comprises flow of carriers (e.g., electrons or holes) across the channel region 32. The electric field required to induce carrier flow across the channel region may be referred to as a threshold voltage ($V_T$). One problem with existing devices utilizing the semiconductor materials described herein (e.g., semiconductor oxides) is that the threshold voltage may increase over time. For instance, hot carriers may be problematically injected into the gate dielectric material 40 during the operation of the transistor 12. Such may cause the dielectric properties of the gate dielectric material 40 to change over time such that the threshold voltage of the device 12 increases as the device ages. Eventually, the threshold voltage may reach a level which is outside of desired operating parameters, leading to device failure. Additionally, the access device 12 may be one of many access devices of a memory array (as discussed below). The array may comprise thousands, hundreds of thousands, millions, etc., of access devices in some embodiments. Generally, it is desired that all of the access devices of a memory array operate substantially identically relative to one another. However, the threshold-voltage variation induced during the aging of the access devices may be nonuniform across the array so that the access devices no longer operate substantially identically to one another. Such may lead to difficulties in operating the memory array, and may eventually lead to memory device failure.

Some embodiments include compositional changes within the semiconductor-material-containing-structure 28 which alleviate or prevent the age-induced changes in threshold voltage. The compositional changes may enable carrier concentrations within the regions 30 and 34 to be arranged along gradients which increase in outward directions from the channel region 32. Specifically, the carrier concentration within the region 30 may increase along the direction shown by the arrow 50a, and the carrier concentration within the region 34 may increase along the direction shown by the arrow 50b.

Figure 1B:
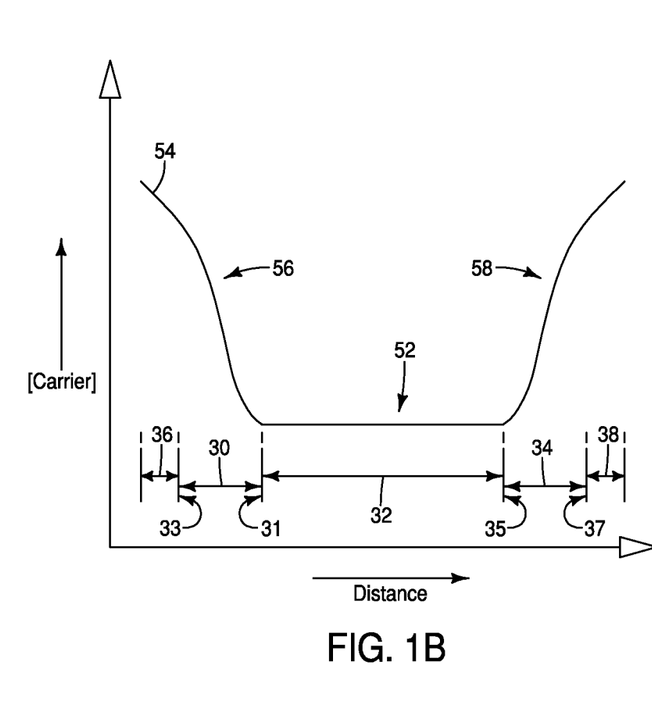
FIG. 1B is a diagrammatic graphical view of an example carrier-concentration-distribution within an active region of the transistor of FIG. 1A.

FIG. 1B graphically illustrates the carrier concentration [carrier] as a function of distance across a region of the pillar 24, and shows a curve 54 illustrating the change in carrier concentration relative to the change in location across the region of the pillar 24. The carrier concentration corresponds to the number of carriers per $cm^3$, and may be expressed in units of "$/cm^3$".

The regions 30, 32, 34, 36 and 38 are shown along a scale at the bottom of the graph of FIG. 1B, and the carrier concentration is indicated relative to such regions. In the illustrated embodiment, the carrier concentration within the channel region 32 is consistent across the entirety of the channel region, and corresponds to a flat region 52 of the curve 54. Such flat region may correspond to any suitable carrier concentration, and in some embodiments may correspond to a carrier concentration within a range of from about $10^{19}/cm^3$ to about $10^{20}/cm^3$. The region 30 is shown to have a first carrier-concentration-gradient which increases in a direction from the inner edge 31 of the region 30 to the outer edge 33 of such region, with such carrier-concentration-gradient corresponding to a region 56 along the curve 54. Similarly, the region 34 is shown to have a second carrier-concentration-gradient which increases in a direction from the inner edge 35 of the region 34 to the outer edge 37 of such region, with such carrier-concentration-gradient corresponding to a region 58 along the curve 54. In some embodiments, the concentration gradients within the regions 30 and 34 may span at least about one order of magnitude (at least a factor of 10), at least about two orders of magnitude (at least a factor of 100), at least about three orders of magnitude (at least a factor of a thousand), etc. For instance, in some embodiments the carrier concentration along the interfaces 31 and 35 of the regions 30 and 34 with the channel region 32 may be less than or equal to about $10^{20}/cm^3$, and the carrier concentration along the interfaces 33 and 37 of the regions 30 and 34 with the materials 36 and 38 may be at least about $10^{21}/cm^3$.

In the illustrated embodiment, the carrier-concentration-gradients of the regions 56 and 58 extend into the oxygen-depleted-materials 36 and 38. In other embodiments, the carrier-concentration-gradients may stop at the interfaces 33 and 37 where the regions 30 and 34 join to the oxygen-depleted-materials 36 and 38.

The carrier-concentration-gradients 56 and 58 may be associated with detectable compositional changes within the semiconductor material 26 of the regions 30 and 34. For instance, in some embodiments the semiconductor material may comprise indium, gallium and zinc (for instance, may comprise InGaZnO, where the formula indicates primary constituents rather than a specific stoichiometry), and the carrier concentration gradients may be associated with changes in the relative concentration of zinc within the first and third regions 30 and 34. The relative concentration of the zinc may be related to the carrier concentration such that higher relative concentrations of zinc indicate higher carrier concentrations.

In some embodiments, the semiconductor material 26 may comprise the InGaZnO (where the formula indicates primary constituents rather than a specific stoichiometry), and the carrier concentration gradients may be associated with changes in the relative concentration of indium within the first and third regions 30 and 34. The relative concentration of the indium may be related to the carrier concentration such that higher relative concentrations of indium indicate higher carrier concentrations.

In some embodiments, the semiconductor material 26 may comprise the InGaZnO (where the formula indicates primary constituents rather than a specific stoichiometry), and the carrier concentration gradients may be associated with changes in the relative concentration of oxygen within the first and third regions 30 and 34. The relative concentration of the oxygen may be inversely related to the carrier concentration such that higher relative concentrations of oxygen indicate lower carrier concentrations.

The compositional changes within the regions 30 and 34 may be formed with any suitable processing. For instance, in some embodiments the compositional changes may be formed in situ during the deposition of the material 26 of the semiconductor-containing-structure 28.

The pillar 24 of FIG. 1B is shown to include a conductive structure 62 over the metal-oxide-region 22. The conductive structure 62 comprises conductive material 64. The conductive material 64 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The storage element 14 is shown to be electrically coupled to the conductive structure 62. In some embodiments, the conductive structure 62 may be omitted.

The storage element 14 and the access device 12 together form a memory cell 60. The memory cell 60 may be representative of a large number of substantially identical memory cells within a memory array, with the term "substantially identical" meaning identical to within reasonable tolerances of fabrication and measurement. The memory array may comprise hundreds, thousands, millions, etc., of the memory cells.

Figure 2A:
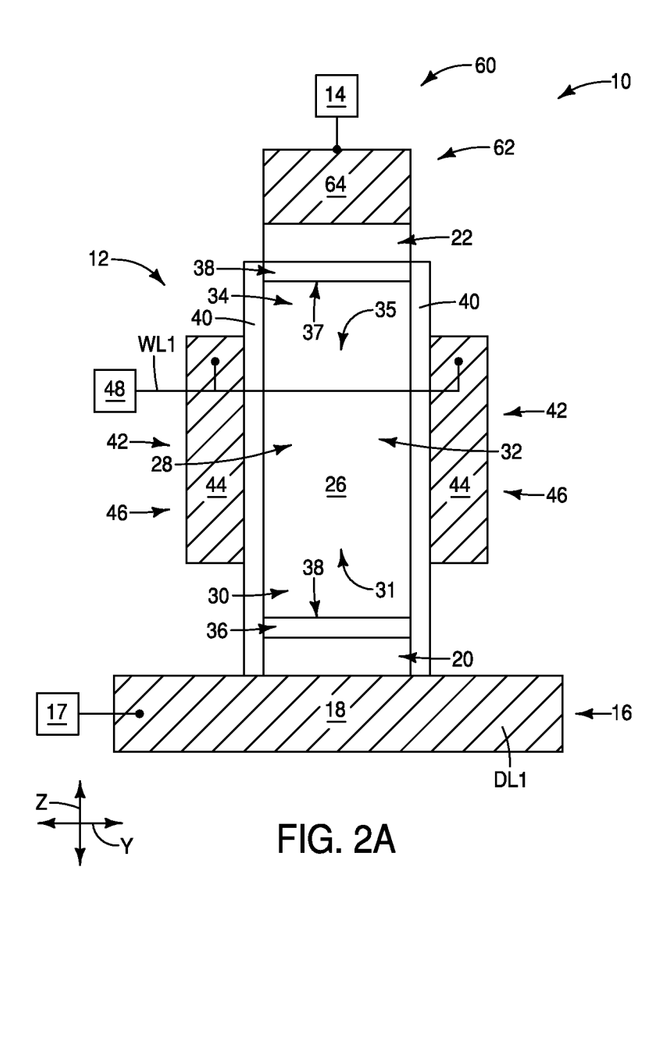
FIG. 2A is a diagrammatic cross-sectional side view of an example transistor.
Figure 2B:
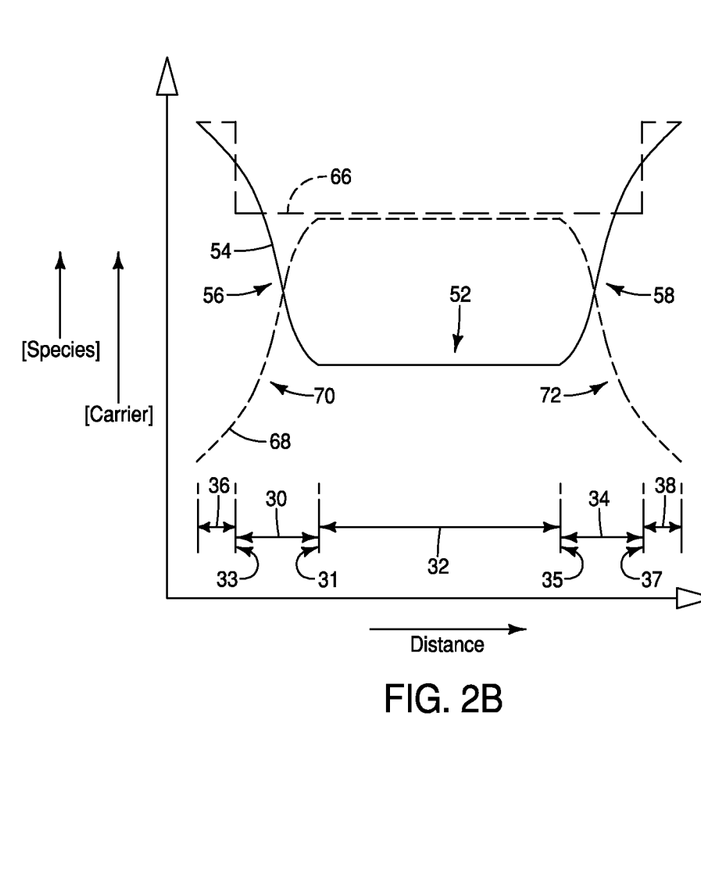
FIG. 2B is a diagrammatic graphical view of an example carrier-concentration-distribution and an example modifier-material-concentration-distribution within an active region of the transistor of FIG. 1A.

FIG. 2A shows a memory cell 60 similar to the memory cell of FIG. 1A. The semiconductor-material-containing-structure 28 comprises a distribution of carrier concentration similar to that of the device of FIG. 1, as shown in FIG. 2B. However, the distribution of the carrier concentration within the device of FIG. 2A may be formed by a different methodology than the in-situ-deposition-methodology described above with reference to FIG. 1. FIG. 2B shows an initial distribution 66 within a region of the semiconductor material 26 (FIG. 2A). The distribution 66 pertains to a first species, with such first species being related to the carrier concentration. For instance, in some embodiments the distribution 66 may pertain to the distribution of oxygen within InGaZnO (where the chemical formula indicates primary constituents rather than a specific stoichiometry). The oxygen concentration may be inversely related to the concentration of carrier, as described above with reference to FIG. 1B.

In some embodiments, the distribution 66 of FIG. 2B may be achieved in situ during the formation of the material 26 of FIG. 2A. For instance, the structure 28 may be formed to comprise semiconductor material 26, where the semiconductor material 26 includes at least one element selected from Group 13 of the periodic table in combination with at least one element selected from Group 16 of the periodic table (e.g., the semiconductor material 16 may comprise a semiconductor oxide, such as, for example, an oxide comprising oxygen in combination with indium, gallium and zinc). The structure includes the first, second and third regions 30, 32 and 34, with the second region being between the first and third regions. The first region 30 has the inner and outer edges 31 and 33 described above with reference to FIG. 1, and the third region 34 comprises the inner and outer edges 35 and 37 described above with reference to FIG. 1.

FIG. 2B also shows an initial distribution 68 of a second species. The second species may be a modifier material which is incorporated into the semiconductor material 26, and which reacts with the semiconductor material to alter the distribution of the first species. In some embodiments, the modifier material may comprise one or both of boron and carbon. The modifier material is provided to comprise a first concentration gradient 70 which increases from the outer edge 33 to the inner edge 31, and to comprise a second concentration gradient 72 which increases from the outer edge 37 to the inner edge 35.

Subsequently, the material 26 is subjected to reducing conditions (e.g., subjected to thermal processing and exposure to one or both of ammonia ($NH_3$) and hydrogen ($H_2$)) to impose the carrier concentration gradients 56 and 58 within the semiconductor material 26. Specifically, the modifier material reacts with one or more components of the semiconductor material 26 to alter the distribution 66 and thereby generate the indicated curve 54 pertaining to the carrier concentration. In some embodiments, the modifier material may react with indium-oxygen bonds and/or zinc-oxygen bonds to reduce the concentration of oxygen, and to thereby increase the carrier concentration (possibly through formation of oxygen vacancies).

At least some of the modifier material (e.g., carbon and/or boron) may remain within the semiconductor material 26 in a finished structure (e.g., in the memory cell 60 of FIG. 2A).

Figure 3A:
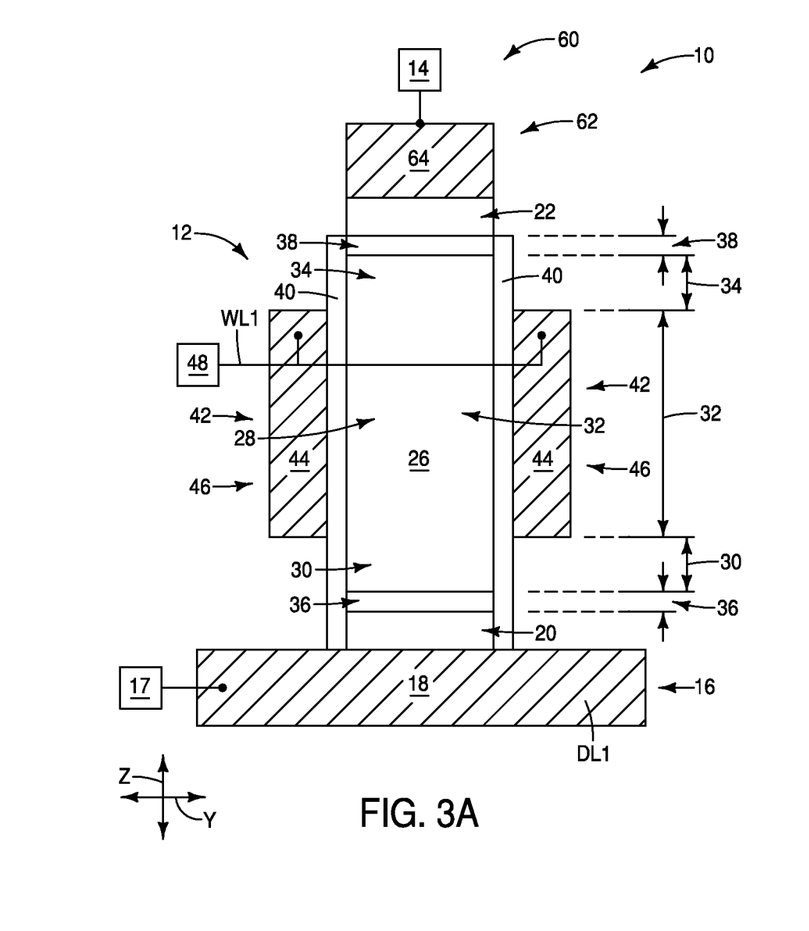
FIG. 3A is a diagrammatic cross-sectional side view of an example transistor.
Figure 3B:
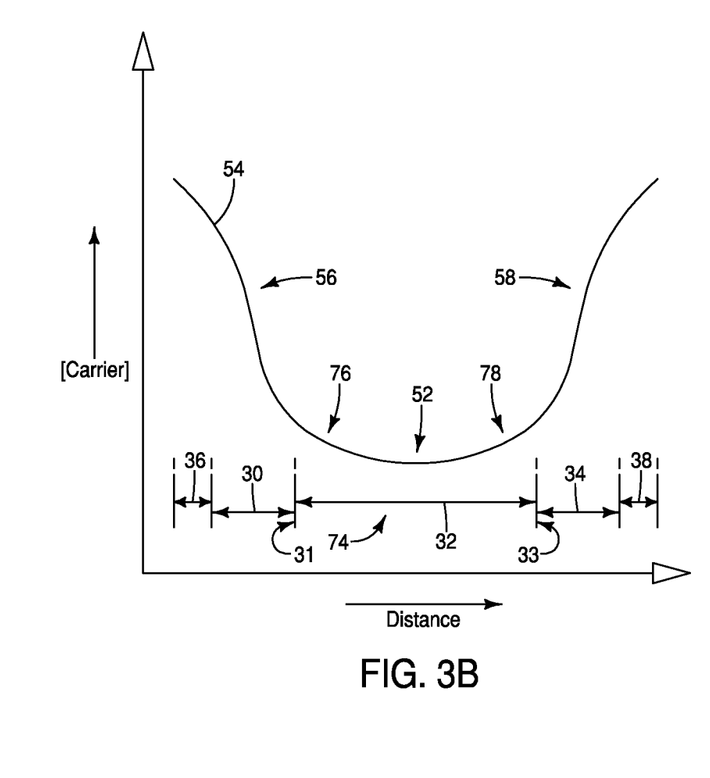
FIG. 3B is a diagrammatic graphical view of an example carrier-concentration-distribution within an active region of the transistor of FIG. 3A.

The embodiments of FIGS. 1B and 2B show that the carrier concentration within the channel region 32 is consistent across the entirety of the channel region, and thus corresponds to a flat region 52 of the curve 54. In other embodiments, the gradients within the regions 56 and 58 may extend to the channel region 32 so that the region 52 of the curve 54 is not flat. FIG. 3A shows a memory cell 60 analogous to that of FIG. 1, but FIG. 3B shows that the memory cell of FIG. 3A has a carrier concentration which changes across the channel region 32 rather than being at a consistent level across the channel region. In some embodiments, the channel region 32 may be considered to have a first edge at the interface 31 adjacent the first region 30, and to have a second edge at the interface 33 adjacent the second region 34. The channel region also comprises an internal region 74 between the two edges. The carrier concentration has a concentration gradient 76 which decreases from the first edge 31 to the internal region 74, and has a concentration gradient 78 which increases from the internal region 74 to the second edge 33.

Figure 4A:
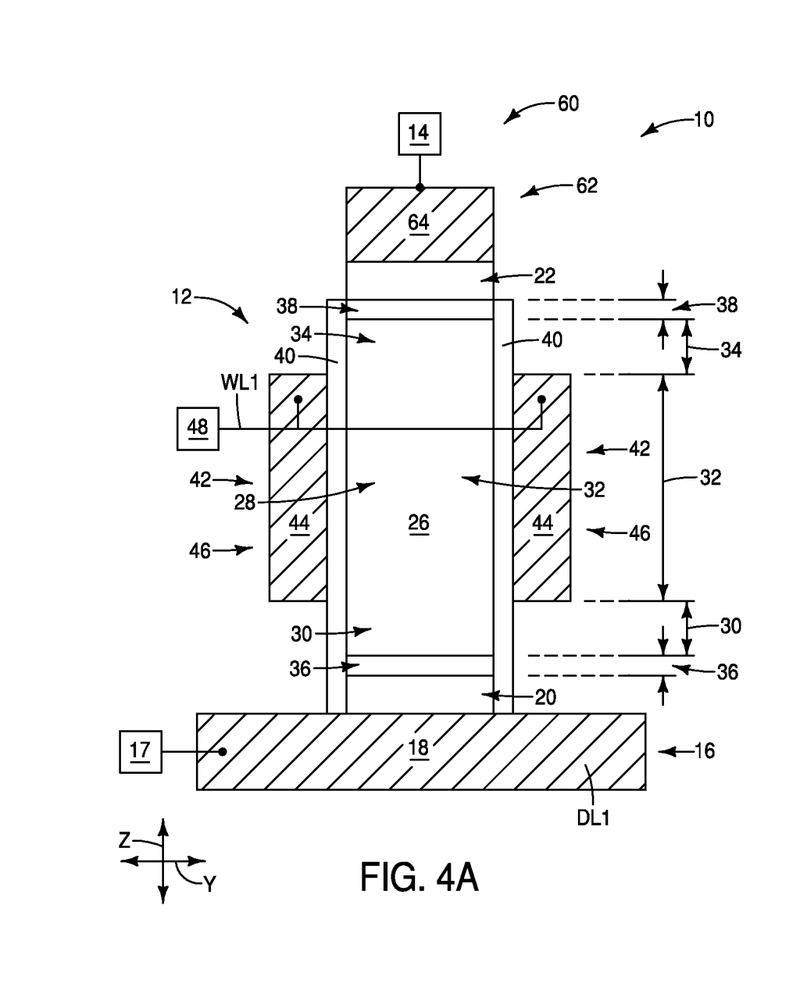
FIG. 4A is a diagrammatic cross-sectional side view of an example transistor.
Figure 4B:
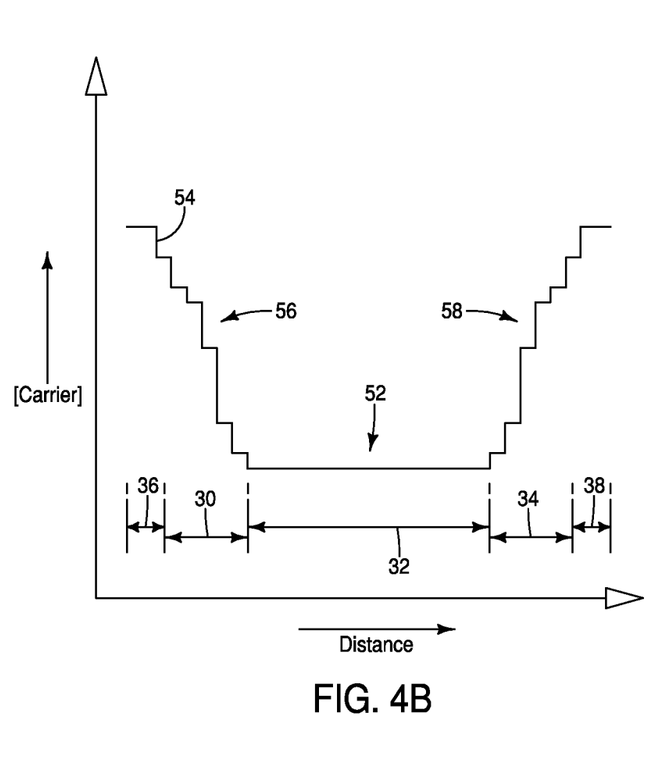
FIG. 4B is a diagrammatic graphical view of an example carrier-concentration-distribution within an active region of the transistor of FIG. 4A.

The illustrated carrier-concentration-gradients of FIGS. 1B, 2B and 3B are continuous gradients. In other embodiments, the carrier-concentration-gradients may be step gradients as discussed with reference to FIGS. 4A and 4B. Specifically, FIG. 4A shows a memory cell 60 analogous to that of FIG. 1A, and FIG. 4B shows that the carrier concentration comprises step gradients within the regions 56 and 58, rather than the continuous gradients of FIG. 1B.

The regions 30 and 34 of the access transistors 12 of FIGS. 1A, 2A, 3A and 4A are on opposing sides of the channel regions 32. In some embodiments, the regions 30 and 34 may be considered to be analogous to lightly-doped-diffusion regions ($L_{DD}$ regions) of conventional silicon-containing transistors. The illustrated access devices 12 of FIGS. 1A, 2A, 3A and 4A have regions 30 and 34 which are substantially the same vertical lengths as one another. Accordingly, the access devices 12 of FIGS. 1A, 2A, 3A and 4A may be considered to be symmetric across the semiconductor-material-containing-structure 28. In other embodiments, one of the regions 30 and 34 may be substantially longer than the other of the regions, and accordingly an access device 12 may be asymmetric across the semiconductor-material-containing-structure 28. For instance, FIG. 5 shows an access device 12 in which the lower region 30 is vertically longer than the upper region 34.

Figure 5:
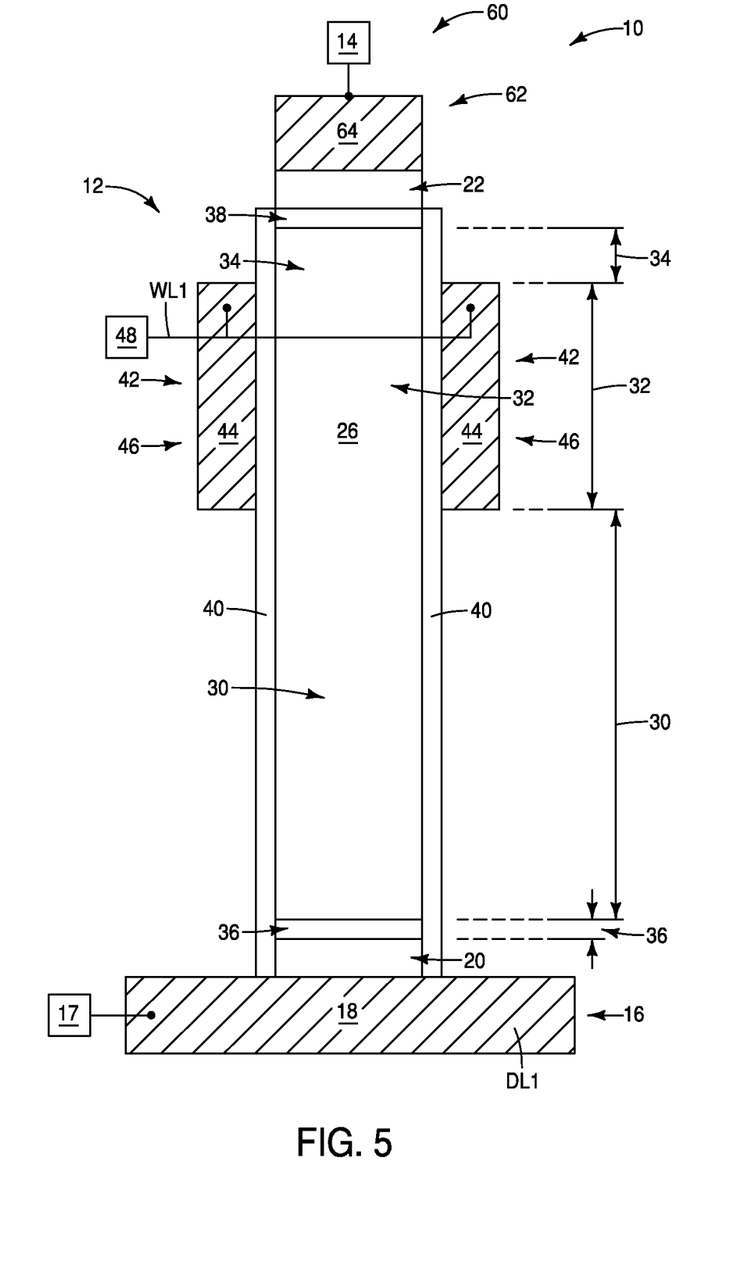
FIG. 5 is a diagrammatic cross-sectional side view of an example transistor.

An advantage of the configuration of FIG. 5 is that such may alleviate, and even prevent, problematic capacitive coupling between the conductive structures 16 and 46 (e.g., digit lines and wordlines) in applications in which the problematic capacitive coupling would otherwise occur. Since the region 30 is longer than the region 34, it may be desired to provide a higher average carrier concentration within the region 30 than within the region 34 to make up for the increased length of the region 30 (i.e., to make up for the increased distance that carriers need to travel across the region 30 relative to the region 34 during operation of the access device 12).

Figure 6:
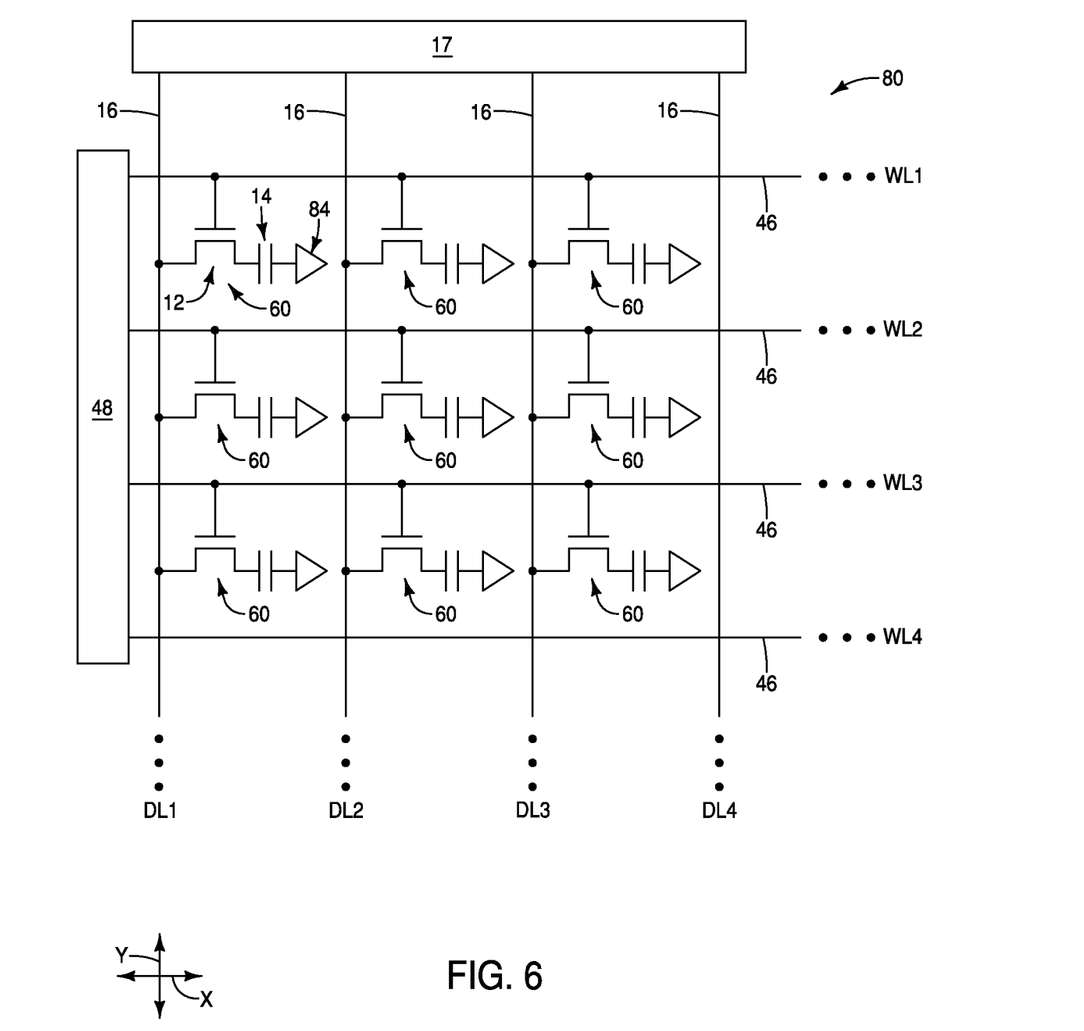
FIG. 6 is a diagrammatic schematic view of an example region of an example memory array.

Memory arrays comprising the memory devices 60 may have any suitable configurations. FIG. 6 shows an example configuration for a DRAM array 80. Such configuration has digit lines 16 (DL1-DL4) coupled with the sensing circuitry 17 and extending along columns of the array, and has wordlines 46 (WL1-WL4) coupled with the driver circuitry 48 and extending along rows of the array. The memory cells 60 comprise the access transistors 12 and the storage elements 14, with the illustrated storage elements being configured as capacitors. Each of the capacitors has a first electrical node coupled with an associated access device 12, and has a second electrical node coupled with a reference voltage source 84 (e.g., a common plate voltage, such as, for example, ground, VCC/2, etc.). Each of the memory cells 60 is uniquely addressed by one of the digit lines in combination with one of the wordlines.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a transistor having an active region containing semiconductor material. The semiconductor material includes at least one element selected from Group 13 of the periodic table in combination with at least one element selected from Group 16 of the periodic table. The active region has a first region, a third region offset from the first region, and a second region between the first and third regions. The first region has an inner edge adjacent to the second region and an outer edge distal from the second region. The third region has an inner edge adjacent to the second region and an outer edge distal from the second region. A gating structure is operatively adjacent to the second region. A first carrier-concentration-gradient is within the first region. The first carrier-concentration-gradient increases along a direction from the inner edge of the first region to the outer edge of the first region. A second carrier-concentration-gradient is within the third region. The second carrier-concentration-gradient increases along a direction from the inner edge of the third region to the outer edge of the third region.

Some embodiments include an integrated assembly comprising an access device between a storage element and a conductive structure. The access device comprises an active region comprising semiconductor material. The semiconductor material comprises a semiconductor oxide. The active region comprises a first region, a third region offset from the first region, and a second region between the first and third regions. The first region has an inner edge adjacent to the second region and an outer edge distal from the second region. The third region has an inner edge adjacent to the second region and an outer edge distal from the second region. A gating structure is operatively adjacent to the second region. A first carrier-concentration-gradient is within the first region. The first carrier-concentration-gradient increases along a direction from the inner edge of the first region to the outer edge of the first region. A second carrier-concentration-gradient is within the third region. The second carrier-concentration-gradient increases along a direction from the inner edge of the third region to the outer edge of the third region. A first oxygen-depleted-region is outward of the first region. A second oxygen-depletedregion is outward of the third region. A first conductive-metal-oxide is outward of the first oxygen-depleted-region and is electrically coupled with the conductive structure. A second conductive-metal-oxide is outward of the second oxygen-depleted-region and is electrically coupled with the storage element.

Some embodiments include a method of forming an integrated assembly. A structure is formed to comprise semiconductor material. The semiconductor material has at least one element selected from Group 13 of the periodic table in combination with at least one element selected from Group 16 of the periodic table. The structure has a second region offset from a first region. The first region has an inner edge adjacent the second region and has an outer edge distal from the second region. A modifier material is incorporated into the semiconductor material. The modifier material comprises one or both of carbon and boron and is provided in a concentration gradient which increases from the outer edge to the inner edge. The semiconductor material is subjected to reducing conditions to impose a carrier-concentration-gradient into the semiconductor material. The carrier-concentration-gradient is substantially inverse to the concentration gradient of the modifier material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A transistor comprising:
    an active region comprising semiconductor material; the active region comprising a first region, a third region offset from the first region, and a second region between the first and third regions; the first region having an inner edge adjacent the second region and an outer edge distal from the second region; the third region having an inner edge adjacent the second region and an outer edge distal from the second region;
    a gating structure operatively adjacent the second region;
    a first carrier-concentration-gradient within the first region, the first carrier-concentration-gradient increasing along a direction from the inner edge of the first region to the outer edge of the first region; and
    a second carrier-concentration-gradient within the third region, the second carrier-concentration-gradient increasing along a direction from the inner edge of the third region to the outer edge of the third region.

2. The transistor of claim 1 wherein the third region is vertically offset from the first region.

3. The transistor of claim 1 wherein the third region is about a same length as the first region.

4. The transistor of claim 1 wherein the third region is a different length than the first region.

5. The transistor of claim 1 wherein the first and second carrier-concentration-gradients are continuous gradients.

6. The transistor of claim 1 wherein the first and second carrier-concentration-gradients are step gradients.

7. The transistor of claim 1 wherein the semiconductor material comprises indium, gallium and zinc.

8. The transistor of claim 1 wherein the second region has a first edge adjacent the first region, a second edge adjacent the third region, and an internal region between the first and second edges; and further comprising a third carrier-concentration-gradient within the second region; the third carrier-concentration-gradient decreasing from the first edge to the internal region, and increasing from the internal region to the second edge.

9. The transistor of claim 1 wherein the semiconductor material is a semiconductor oxide material.

10. The transistor of claim 1 comprising gate dielectric material between the gating structure and the second region, and being configured to alleviate hot carrier degradation of the gate dielectric material.

11. The transistor of claim 1 comprising a threshold voltage associated with the second region, and being configured to alleviate age-induced increase of the threshold voltage.

12. An integrated assembly comprising an access device between a storage element and a conductive structure; the access device comprising:
    an active region comprising semiconductor material; the active region comprising a first region, a third region offset from the first region, and a second region between the first and third regions; the first region having an inner edge adjacent the second region and an outer edge distal from the second region; the third region having an inner edge adjacent the second region and an outer edge distal from the second region;
    a gating structure operatively adjacent the second region;
    a first carrier-concentration-gradient within the first region, the first carrier-concentration-gradient increasing along a direction from the inner edge of the first region to the outer edge of the first region; and
    a second carrier-concentration-gradient within the third region, the second carrier-concentration-gradient increasing along a direction from the inner edge of the third region to the outer edge of the third region.

13. The integrated assembly of claim 12 wherein the access device further comprises:
    a first oxygen-depleted-region outward of the first region;
    a second oxygen-depleted-region outward of the third region;
    a first conductive-metal-oxide outward of the first oxygen-depleted-region and electrically coupled with the conductive structure; and
    a second conductive-metal-oxide outward of the second oxygen-depleted-region and electrically coupled with the storage element.

14. The integrated assembly of claim 13 wherein the semiconductor material comprises indium, gallium, zinc and oxygen.

15. The integrated assembly of claim 14 wherein the first and second carrier-concentration-gradients are associated with changes in a relative concentration of zinc within the first and third regions; the relative concentration of zinc being higher in regions having higher carrier concentration than in regions having lower carrier concentration.

16. The integrated assembly of claim 14 wherein the first and second carrier-concentration-gradients are associated with changes in a relative concentration of indium within the first and third regions; the relative concentration of indium being higher in regions having higher carrier concentration than in regions having lower carrier concentration.

17. The integrated assembly of claim 14 further comprising one or both of carbon and boron with the first, second and third regions.

18. The integrated assembly of claim 12 wherein the conductive structure is a first linear structure and is coupled with sensing circuitry, and wherein the gating structure is part of a second linear structure which is coupled with driver circuitry.

19. The integrated assembly of claim 12 wherein the storage element and the access device are within a memory cell, and wherein the memory cell is one of many substantially identical memory cells of a memory array.

20. A method of forming an integrated assembly, comprising:
- forming a structure comprising semiconductor material; the structure having a second region offset from a first region; the first region having an inner edge adjacent the second region and having an outer edge distal from the second region;
- incorporating a modifier material into the semiconductor material, the modifier material comprising one or both of carbon and boron and being provided in a concentration gradient which increases from the outer edge to the inner edge; and
- subjecting the semiconductor material to reducing conditions to impose a carrier-concentration-gradient into the semiconductor material, the carrier-concentration-gradient being substantially inverse to the concentration gradient of the modifier material.

21. The method of claim 20 wherein the semiconductor material comprises indium, gallium, zinc and oxygen.

* * * * *